(12) United States Patent
Visweswariah

(10) Patent No.: US 6,922,819 B2
(45) Date of Patent: Jul. 26, 2005

(54) SYSTEM AND METHOD OF OPTIMAL WAVEFORM SHAPING

(75) Inventor: Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 10/354,237

(22) Filed: Jan. 29, 2003

(65) Prior Publication Data

US 2004/0148579 A1 Jul. 29, 2004

(51) Int. Cl.[7] .............................................. G06F 17/50
(52) U.S. Cl. ......................................................... 716/2
(58) Field of Search ................................ 716/5, 4, 2, 1

(56) References Cited

U.S. PATENT DOCUMENTS

| | | | |
|---|---|---|---|
| 5,886,908 A | 3/1999 | Conn et al. | 364/578 |
| 5,999,714 A | 12/1999 | Conn et al. | 395/500.03 |
| 2004/0002844 A1 * | 1/2004 | Jess et al. | 703/14 |

OTHER PUBLICATIONS

TILOS; A Posynomial Programming Approach To Transistor Sizing, by J. P.Fishburn, A.E. Dunlop; AT&T Bell Laboratories, Murray Hill, New Jersey 07974; International Conference On Computer–Aided Design, 1985, pp. 326–328.
Gradient–Based Optimization of Custom Circuits Using A Static–Timing Formulation, by A.R. Conn, I.M. Elfadel, W.W. Molzen, Jr., P.R. O'Brien, P.N. Strenski, C. Visweswariah, C.B. Whan, IBM Thomas J. Watson Research Center, Route 134 and Taconic, Yorktown Heights, NY 10598 and IBM Burnet Road, M.S. 9460, Austin, TX 78758, pp. 452–459.
DELIGHT.SPICE: an Optimization–Based System For The Design Of Integrated Circuits, by William Nye, Member IEEE, David C. Riley, Alberto Sangiovanni–Vincentelli, Fellow, IEEE, and Andre L. Tits, Member, IEEE, pp. 501–519.
Transient Sensitivity Computation ForMOSFET Circuits, by Dale E. Hocevar, Member IEEE, Ping Yang, Member, IEEE, Timothy N. Trick, Fellow, IEEE, and Burton D. Epler, Member, IEEE, pp. 609–620.
The Generalized Adjoint Network and Network Sensitivities, by Stephen W. Director, Member, IEEE and Ronald A. Rohrer, Member, IEEE, Reprinted by permission from IEEE Transactions On Circuit Theory, vol. CT–16, No. 3, Aug. 1969, Copyright 1969, by the Institute of Electrical and Electronics Engineers, Inc., pp. 318–323.
Handbook Of Mathematical Functions, With Formulas, Graphs, And Mathematical Tables, Edited by Milton Abramowitz and Irene A. Stegun, Dover Publications, Inc. New York, p. 11.
Electronic Circuit and System Simulation Methods, by Lawrence T. Pillage, Ronald A. Rohrer, Chandramouli Visweswariah, McGraw–Hill, Inc., pp. 47–64.
Linear and NonLinear Programming, by Stephen G. Nash and Ariela Sofer, George Mason University, The McGraw–Hill Companies, Inc., pp. 427–566.

* cited by examiner

Primary Examiner—Stacy A. Whitmore
Assistant Examiner—Sun James Lin
(74) Attorney, Agent, or Firm—Louis J. Percello; Law Office of Charles W. Peterson, Jr.

(57) ABSTRACT

Component values and/or sizes in an electrical circuit are optimized with waveform shaping considerations in addition to other constraints and/or objective functions such as delay, power, gain, area or rise/fall times. A consistent metric is defined as a quality measure of waveform match. Gradients of these metrics are computed by efficient methods, thus enabling mathematical optimization by a numerical optimizer. Two different useful metrics and the corresponding efficient gradient computation techniques are described.

34 Claims, 5 Drawing Sheets

SYSTEM AND METHOD OF OPTIMAL WAVEFORM SHAPING

FIELD OF THE INVENTION

This invention relates to waveform shaping in electrical circuits. More specifically, the invention relates to optimally adjusting component values and/or sizes in any type of electrical circuit to obtain a match between a desired set of waveforms and the corresponding actual waveforms of the circuit, while satisfying other optimization criteria.

BACKGROUND OF THE INVENTION

All electrical circuits exhibit waveforms such as a voltage waveform at each node, a current waveform through each branch and a voltage waveform across each branch of the circuit. A waveform is just the variation of a quantity of interest, such as voltage or current, with time. Waveforms are also exhibited in the frequency-domain where the circuit is linearized about an operating point and the small-signal behavior of the circuit is studied across a range of frequencies.

In engineering applications, it is often desirable to achieve a particular waveform shape. For example, if a clock distribution circuit on an integrated circuit is being designed, it may be desirable to have the clock waveforms at various target latches switch at the same time and have as close a voltage waveform to an "ideal trapezoidal clock waveform" as possible at each of the latch destinations. Similarly, the gain or phase characteristics of a filter circuit may have a desired shape in the frequency domain. Similarly, it may be required to optimally power a communication circuit to obtain a desired signal-to-noise ratio. During the design, once the topology of a circuit has been established, component values and/or sizes are adjusted or tuned to obtain a match between a desired set of waveforms and the actual waveforms of the circuit as predicted by circuit simulation or analysis. During the adjusting process, there may be other constraints or objective functions (quantities being minimized or maximized) such as performance requirements on the circuit other than waveform shapes (such as power, delay, area rise/fall time or gain considerations), or lower and upper bounds on the parameters being adjusted. After the simulations show that the waveforms are "close enough" in their shape and all the other criteria are met, the circuit is committed to manufacturing.

Component values and/or sizes include resistance values, capacitance values, inductance values, lengths of transistors, widths of transistors, choice of bias currents, and so on. The process of "tuning," "tweaking" or "adjusting" these design parameters for waveform shaping is typically an iterative, tedious and manual procedure. A set of choices of component values and/or sizes is called an iteration. Each iteration is followed by circuit simulation or analysis by means of a computer program to establish that the match between the actual waveforms and the desired waveforms improved and that the other optimization criteria improved. This iterative procedure is repeated until satisfactory results are obtained as predicted by the circuit simulation program. The updating of component values and/or sizes from iteration to iteration typically relies on human intuition and experience.

It is desirable to automate the procedure of tuning component values and/or sizes. It is further often desirable to tune the circuit to obtain the best possible match of an entire waveform or set of waveforms rather than some particular attributes of characteristics of the waveforms such as delay or rise/fall time. For example, for a signal that should be quiet but is exhibiting ringing, it may be desirable to tune the circuit to minimize the amount of ringing during the time when the line should otherwise be quiet. In modem digital integrated circuits, digital waveforms no longer look like classical square waves or trapezoidal waves. Due to effects such as capacitive coupling, inductive coupling, charge regeneration circuits and transmission line effects, the waveforms look like analog waveforms and their noise immunity may be compromised. With the advent of ultra-small electronic devices and nanotechnology, this trend will only get worse. Thus, it may be desirable to tune the various components of a circuit to shape an individual waveform, for example, to tune the clock distribution circuitry to obtain the "healthiest" possible digital waveform at the target latches. It may also be desirous to optimize some other performance of the circuit (such as delay or power) subject to a requirement on the "quality of match" between a desired set of waveforms and the corresponding actual waveforms. In all of these examples, it is desirous to obtain the best possible match on the entire waveform rather than matching particular attributes of the waveform, and it is desirous to employ automated means.

PROBLEMS WITH THE PRIOR ART

Prior art methods for waveform shaping are slow, tedious, manual, error-prone, and do not have any guarantee of obtaining the optimal solution. They rely on human intuition and skill, or heuristic techniques to adjust component values and/or component sizes in an iterative loop with circuit simulation used to judge the benefit of the changes at each step.

On the other hand, circuit optimizers have been developed with goals other than waveform shaping. For example, in the context of digital integrated circuits, researchers have invented methods to optimize particular aspects of waveforms, such as the height of a dip due to noise, or the delay, slew or arrival time of a waveform. The tuning of component values to reduce or minimize noise effects is described in A. R. Conn, R. A. Haring, C. Visweswariah, "Method for incorporating noise considerations in automatic circuit optimization," U.S. Pat. No. 5,999,714. The tuning of transistor sizes to optimize the speed or area of a digital integrated circuit is a much-researched topic and is described, for example, in J. P. Fishburn and A. E. Dunlop, "TILOS: A posynomial programming approach to transistor sizing," Proceedings of the International Conference on Computer-Aided Design, pages 326–328, November 1985, and in A. R. Conn, I. M. Elfadel, W. W. Molzen, Jr., P. R. O'Brien, P. N. Strenski, C. Visweswariah and C. B. Whan, "Gradient-based optimization of custom circuits using a static-timing formulation," Proceedings of the 1999 Design Automation Conference, pages 452–459, June 1999. In the context of analog circuits, a system to optimize particular measures of performance of the circuit is described in W. Nye, D. C. Riley, A. Sangiovanni-Vincentelli and A. L. Tits, "DELIGHT.SPICE: An optimization-based system for the design of integrated circuits," IEEE Transactions on Computer-Aided Design of Integrated Circuits and Systems, number 4, volume CAD-7, pages 501–519, April 1988. These references are herein incorporated by reference in their entirety.

A typical prior-art circuit optimization system (flow 100) is shown in FIG. 1. The procedure begins with a circuit with starting component values and/or sizes (box 110). An optimization problem is formulated, typically with zero or more objective function(s), zero or more constraint(s), and optionally lower and upper bounds on the component values and/or sizes (box 120). The starting circuit is simulated using a circuit simulation or circuit analysis program (box 130). From the results of the simulation, the value of each objective function, each constraint, and the gradients thereof with respect to each tunable parameter are obtained (box 140). All this information is fed to a nonlinear optimizer (box 150). If the circuit is judged not to be optimal (box 160), at least one more iteration is required. The optimizer calculates a change in each tunable component value and/or size (box 170) and feeds the circuit back into the circuit simulator (box 130) with the modified values and/or sizes. The iterative loop is repeated until an optimal circuit is obtained (box 160) and the procedure halts (box 180).

However, there is no such prior-art automated procedure to tune a circuit to produce a desired waveform or desired set of waveforms, a capability that is important in the design of modern microelectronic circuits.

OBJECTS OF THE INVENTION

An object of this invention is an improved system and method for waveform shaping.

An object of this invention is an improved system and method for adjusting values and/or sizes of electrical components to improve waveform shapes in electrical circuits.

An object of this invention is an improved system and method for designing electrical circuits by automated means with improved waveform shapes.

An object of this invention is an improved system and method for designing electrical circuits by automated means with optimal waveform shapes, subject to other requirements and constraints.

An object of this invention is an improved system and method for designing electrical circuits by automated means with optimal performance, subject to a required quality of match between a desired set of waveforms and the corresponding actual waveforms, and subject to other requirements and constraints.

SUMMARY OF THE INVENTION

The present invention is a system and method for automatically optimizing component values and/or sizes in an electrical circuit with waveform shaping goals. The invention employs an iterative numerical optimizer that repeatedly analyzes the candidate circuit by means of circuit simulation. The simulation is used to compute all measures of performance being optimized or constrained, as well as a measure or metric of the quality of the match between the desired set of waveforms and the corresponding actual waveforms. The simulator also determines the gradient of the metric (measure of the quality of the match of each waveform) to all the component values and/or sizes being tuned. Since a large number of waveforms may be involved and since gradients may be necessary with respect to a large number of component values and/or sizes, the invention, in non-limiting alternative embodiments, includes efficient gradient computation procedures. In other non-limiting alternative embodiments, the nonlinear optimizer makes use of this function and gradient information to come up with new component values and/or sizes in an iterative manner until the optimal set of component values and/or sizes is obtained.

BRIEF DESCRIPTION OF THE FIGURES

The foregoing and other objects, aspects, and advantages will be better understood from the following non-limiting detailed description of preferred embodiments of the invention with reference to the drawings that include the following.

DETAILED DESCRIPTION OF THE INVENTION

Figure 1:
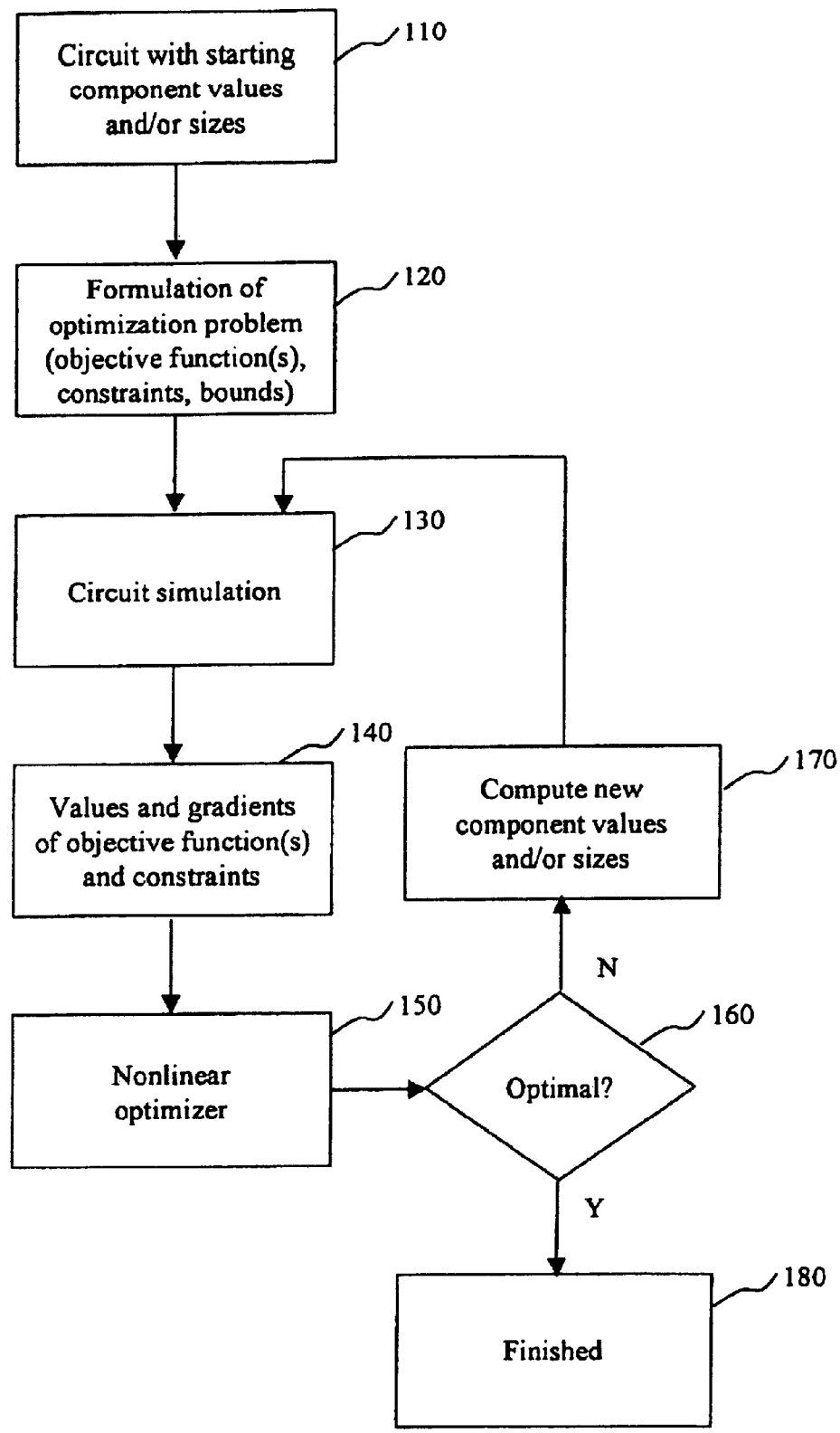
FIG. 1 is a block diagram flow chart of a typical prior-art circuit optimization system.
Figure 2:
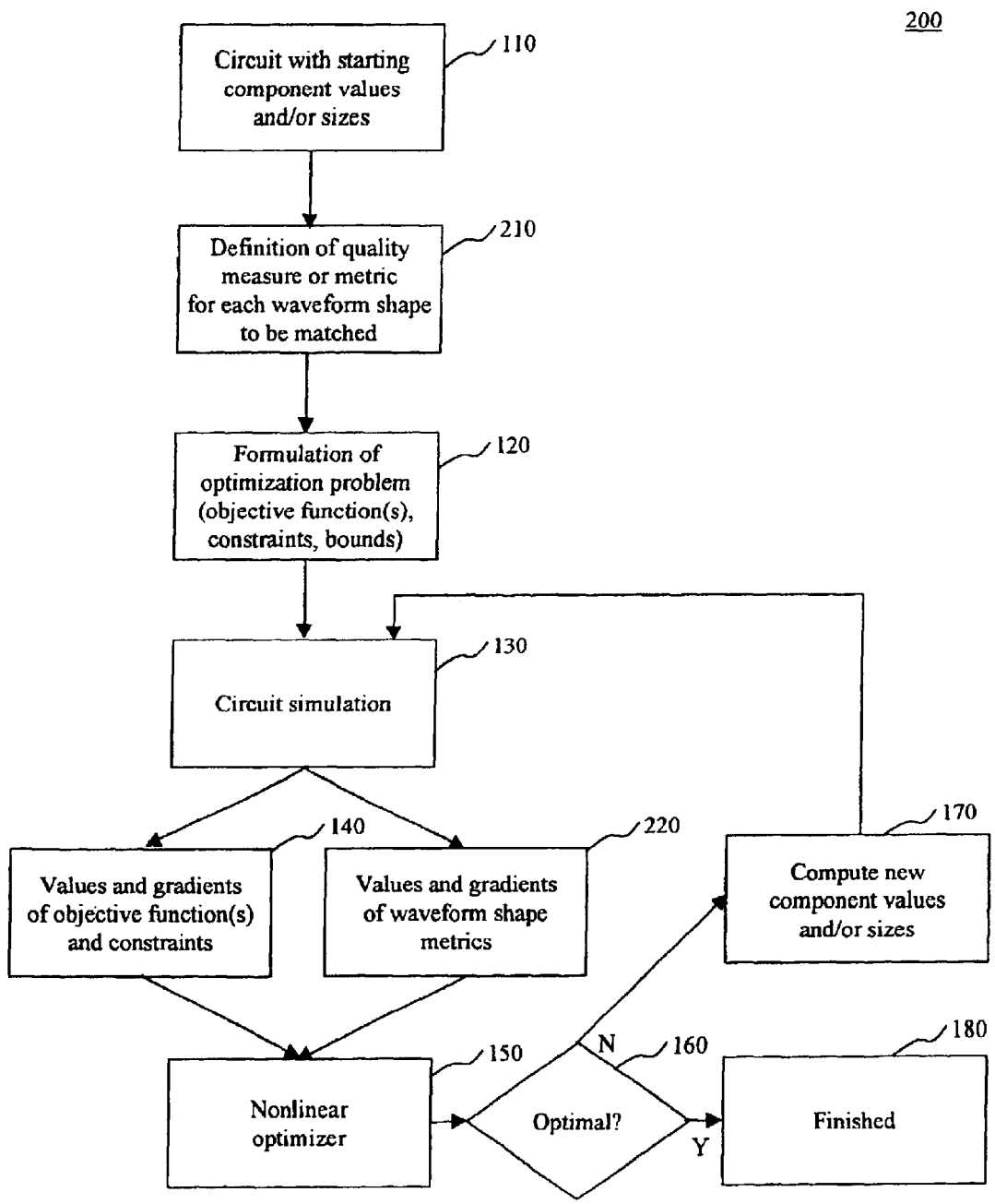
FIG. 2 is a flow chart of the inventive circuit optimization method.

An inventive circuit optimization flow (200) is shown in FIG. 2, which is a block diagram of an optimization system with waveform quality considerations. Steps have been labeled with the same box numbers as FIG. 1 where prior-art methods apply. The invention defines a "measure" or "metric" of the quality of waveform match for each waveform shaping requirement (box 210) and the efficient computation of the gradient of each such "measure" or "metric" with respect to each of the tunable component values and/or sizes (box 220). These two steps will be explained in detail below. This detailed description includes the definition of two non-limiting different example metrics, and three methods of gradient computation for each. Depending on the situation at hand, the best metric and the best method of gradient computation can be selected.

In one preferred embodiment, in order to optimize a circuit with waveform shape considerations, it is necessary to first define a scalar (meaning single-valued) measure of the quality of match between a desired waveform and an actual waveform. Several definitions of such a metric are possible. Once such a metric is established, additional constraints and/or objective function(s) are added to the problem formulation corresponding to waveform shaping requirements (box 120). The goal is to tune or tweak component values and/or sizes to obtain the lowest possible objective function subject to satisfying all the constraints. Each waveform quality metric is a consistent measure (that appears in each waveform quality constraint or objective function) of the closeness between a desired waveform and the corresponding actual waveform of the circuit.

Figure 2A:
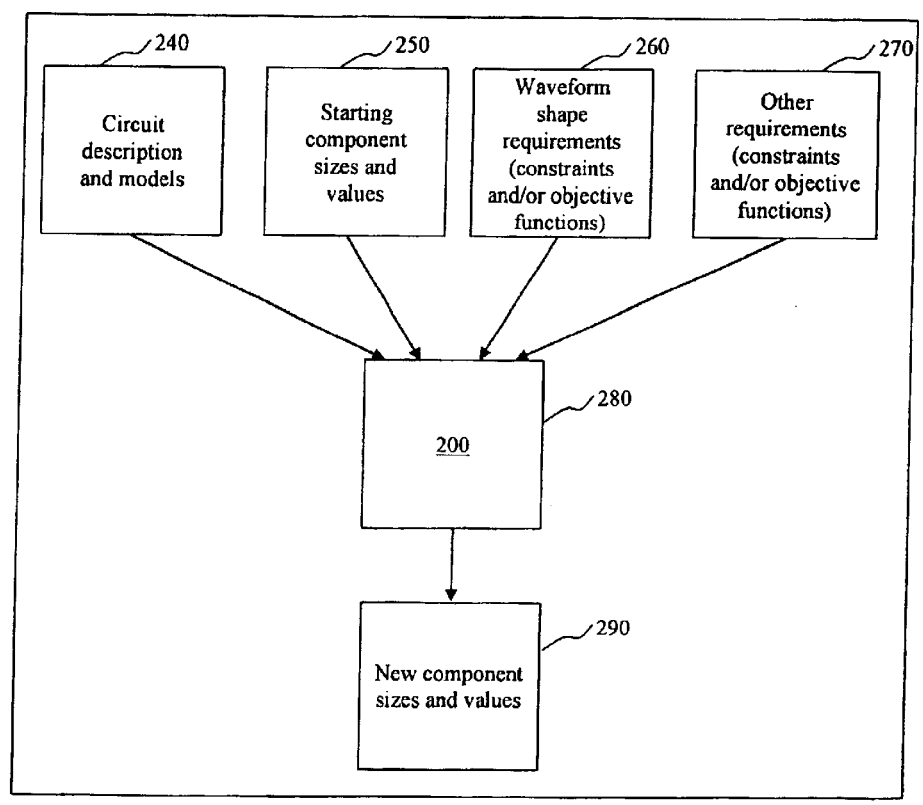
FIG. 2A is a block diagram of the present circuit optimization system, the process of FIG. 2 executing on one or more computers.
Figure 3:
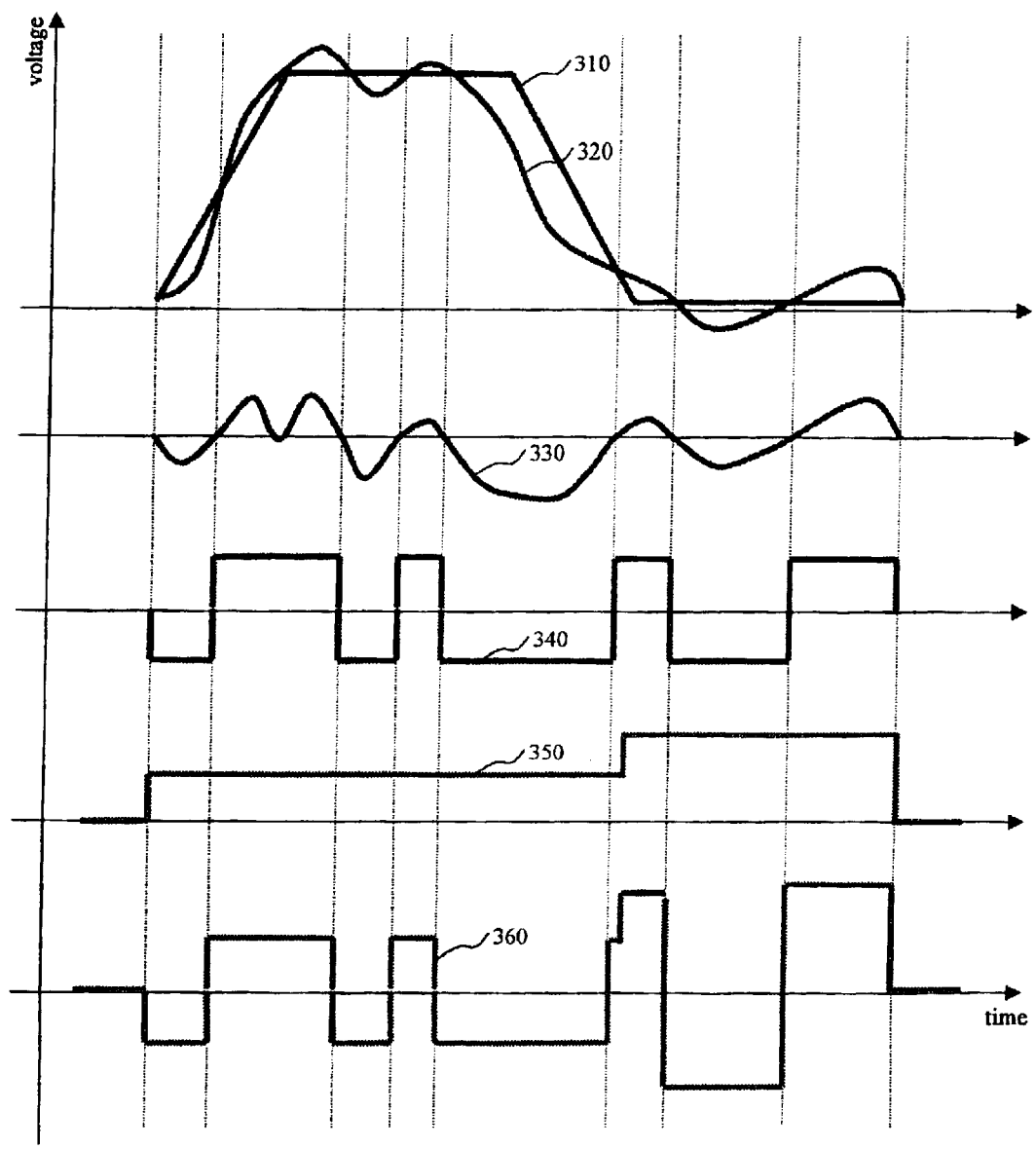
FIG. 3 is a drawing of example waveforms in one preferred embodiment of the invention.

FIG. 2A is a block diagram of the present circuit optimization system, the process 200 of FIG. 2 executing on one or more computers. The system further includes the following inputs to the system: a description of the circuit and its models (box 240); the set of starting component sizes and/or values (box 250); the list of waveform shaping requirements, expressed as objective functions and/or constraints (box 260); and other requirements, also expressed as objective functions and/or constraints (box 270). These inputs are acted upon by process 200 (box 280) to produce the output of the system: the final component sizes and/or values (box 290). In a first preferred embodiment of the invention, the metric is chosen to be the integral of the absolute value of the difference between the desired waveform and the actual waveform in the time interval of interest. Obviously, if the metric goes to zero, we have a perfect match between the desired and actual waveforms. The larger the metric, the more the mismatch. FIG. 3 shows example waveforms to explain this preferred embodiment. Let us call the desired waveform $\overline{v(t)}$ (310) and the actual waveform v(t) (320). The difference between the desired waveform and actual waveform is an error waveform e(t)=v(t)−$\overline{v(t)}$(330). Next, in a non-limiting preferred embodiment, define a square waveform (340)

$$s(t) = \begin{cases} 1 & \text{if } v(t) > \overline{v}(t) \\ -1 & \text{if } v(t) < \overline{v}(t) \\ 0 & \text{if } v(t) = \overline{v}(t) \end{cases}.$$

The user is optionally allowed to provide a weighting waveform w(t)(350) which indicates the relative importance of matching waveforms in different subintervals of time. In this example, it is assumed that matching the waveform in the second half of the time interval is twice as important. Finally, define a waveform y(t)=e(t)w(t)(360). In terms of these waveforms, the method for computing the gradient of the metric of this preferred embodiment with respect to all component values and/or sizes is described below.

The required gradients can be calculated by the well-known direct method described in D. A. Hocevar, P. Yang, T. N. Trick and B. D. Epler, "Transient sensitivity computation for MOSFET circuits," IEEE Transactions on Computer-Aided Design for Integrated Circuits and Systems, volume CAD-4, number 4, October 1985, pages 609–620, or the well-known adjoint method described in S. W. Director and R. A. Rohrer, "The generalized adjoint network and network sensitivities," IEEE Transactions on Circuit Theory, volume CT-16, number 3, pages 318–323, August 1969, or the well-known all-at-once adjoint method described in A. R. Conn, R. A. Haring and C. Visweswariah, "Method of efficient gradient computation," U.S. Pat. No. 5,886,908. In the direct method, the gradient of any number of functions (waveform shape metrics or other measurements) can be computed with respect to one component value or size at a time. In the adjoint method, the gradient of one function can be computed with respect to any number of component values and/or sizes at a time. In the all-at-once adjoint method, gradients of the scalar merit function of the numerical optimizer with respect to all component values and/or sizes are computed in a single analysis. All three methods are incorporated by reference in their entirety and are explained below.

We begin by describing the direct method. Our metric Q is defined to be the integral of the absolute weighted value of e(t), defined formally as $$Q = \int_{t_0}^{t_f} w(t)|v(t) - \overline{v}(t)|dt,$$

where $t_0$ to $t_f$ is the duration of transient simulation of interest, which can be written as $$Q = \int_{t_0}^{t_f} w(t)s(t)[v(t) - \overline{v}(t)]dt.$$

We would like to compute the gradient of this metric with respect to some component value and/or size p, i.e., $$\frac{\partial Q}{\partial p} = \int_{t_0}^{t_f} w(t)s(t)\frac{\partial v(t)}{\partial p}dt = \int_{t_0}^{t_f} y(t)\frac{\partial v(t)}{\partial p}dt$$

since $\overline{v}(t)$ is not a function of p. Also, even though the times at which s(t) changes sign are functions of p, this sensitivity can be ignored by appealing to the well-known Leibniz's theorem since the integrand is zero at all such times. For the statement of Leibniz's theorem, see M. Abramowitz and I. A. Stegun, Editors, "Handbook of Mathematical Functions," Dover Publications, 1972, page 11. Finally, $$\frac{\partial Q}{\partial p} = \int_{t_0}^{t_f} y(t)\hat{v}(t)dt$$

where $\hat{v}(t)$ is the transient sensitivity waveform of the voltage of interest obtained by the direct method. The procedure to implement this in practice is as follows. During the nominal simulation, the error waveform e(t) and its sign s(t) are computed. The waveforms required for excitation of the sensitivity circuit are stored during the nominal simulation. The time-domain sensitivity of the voltage that is being matched is computed as in the well-known direct method, by solving a suitably configured sensitivity circuit. The product of the sensitivity waveform of this signal and y(t) is simply integrated over the required time period to obtain the necessary sensitivity of the metric to the source of variation being considered. All waveform metrics are simultaneously processed as are all the measurements for the other optimization criteria, in a single sensitivity circuit analysis. In the direct method, this procedure would be repeated for each component value and/or size that is tunable to obtain all the required gradients of boxes 140 and 220 in FIG. 2. The direct method thus computes the sensitivity of all metrics to a single tunable parameter at a time. As is well known in regard to the direct method, all nominal and sensitivity analyses of the circuit can be performed simultaneously, with the time-steps of all the circuits moving in lock step.

The adjoint method, on the other hand, can compute the sensitivity of one function (such as a waveform shaping metric) with respect to all tunable parameters in a single analysis. To apply the adjoint method, it is necessary to express the gradient of the metric as a convolution integral from which the sensitization of the adjoint circuit is derived, as shown below. Consider the perturbation of a parameter such as a component value or size from p to p+δp. Then the perturbation in Q can be expressed as $$\delta Q = \int_{t_0}^{t_f} s(t)w(t)\delta v(t)dt,$$

where δv(t) is the time-dependent perturbation of the voltage whose waveform is being matched.

Comparing $$\delta Q = \int_{t_0}^{t_f} y(t)\delta v(t)dt,$$

to the standard "typical term" of a current source in the well-known adjoint method, $$\int_{t_0}^{t_f} \hat{i}_J(\tau)\delta v_J(t)dt,$$

the excitation in the adjoint circuit is $$\hat{i}_J(\tau) = y(t).$$

In other words, the excitation in the adjoint circuit is simply the reverse-time value of y(t) since the relationship between t and τ is τ=$t_0$+$t_f$−t as is the case in any time-domain adjoint circuit analysis.

Once the excitation in the adjoint circuit is known, the nominal circuit is simulated with a grounded zero-valued current source attached to each of the signals whose waveform is being matched. These sources do not change the outcome of the nominal simulation since they are zero-valued. During the nominal simulation, the standard set of waveforms are saved for future convolution purposes, as in the well-known adjoint method. After the nominal simulation is complete, the circuit is suitably configured by replacing each circuit element with its adjoint equivalent. All the excitations are set to zero, whereas the current source excitation at the signal of interest (whose waveform is being matched) is selected to be $\hat{\imath}_j(\tau)$ as described above. Then the adjoint simulation is conducted in reverse-time with this choice of excitation. The waveforms of the adjoint and nominal circuits are convolved to obtain the sensitivity of the quality metric Q with respect to all the component values and/or sizes at once. This entire adjoint procedure must be repeated for each measurement (whether a waveform matching quality metric or other measurement such as delay, rise time or power). Thus all the gradients of boxes 140 and 220 are obtained.

Finally, the all-at-once adjoint procedure is explained below. In this method, it is recognized that the optimizer creates a scalar merit function that is repeatedly minimized in the inner loop of the optimizer. The scalar merit function may be a well-known Lagrangian, an augmented Lagrangian, a barrier function, an exact penalty function or an inexact penalty function, depending on the optimization method employed. Information about merit functions may be found in S. G. Nash and A. Sofer, "Linear and nonlinear programing," McGraw Hill, 1996. Instead of computing the gradients of the individual metrics and measurements, the simulator computes the gradients of the scalar merit function of the optimizer. First a zero-valued source is added at the location of each measurement and metric, and the nominal simulation conducted. Waveforms are saved for later convolution purposes. Then a scaled version of the separate excitation for computing the sensitivity of each separate measurement is simultaneously applied to a suitably configured adjoint circuit. The scale factors are a function of how these measurements appear in the merit function, and can be a function of the nominal simulation results. Then the adjoint simulation is conducted just once, with reversed time. The waveforms of the adjoint and nominal circuit are convolved to obtain the gradients of the scalar merit function with respect to all tunable component values and/or sizes at once, no matter how many measurements and metrics and no matter how many tunable component values and/or sizes in the optimization problem.

In all three methods (direct, adjoint and adjoint-at-a-time) the LU factors of the converged solution of the nominal circuit at each time point can be reused for efficient solution of the sensitivity or adjoint circuit, as the case may be. A description of LU factorization and its benefits may be found in L. T. Pillage, R. A. Rohrer and C. Visweswariah, "Electronic Circuit and System Simulation Methods," McGraw Hill, 1995, Chapter 3, pages 50 to 63.

In a second preferred embodiment, the quality metric is defined to be the largest absolute deviation between the desired and actual waveform in the time interval of interest. Depending on the circuit, the application, and the goals of the optimization, this metric may be more meaningful or useful than that of the first embodiment. In this case, the metric Q is defined as $$Q = \max_{t \in [t_0, t_f]} |v(t) - \bar{v}(t)|.$$

By a simple reformulation of the optimization problem, this metric can be either constrained or minimized. To minimize the metric, an auxiliary optimization variable, is introduced, and the following optimization reformulation is employed:

$$\min_{p,z} z$$

$$s.t. \int_{t_0}^{t_f} \min[0, \{z - |v(t) - \bar{v}(t)|\}] dt = 0$$

s.t. other constraints.

Figure 4:
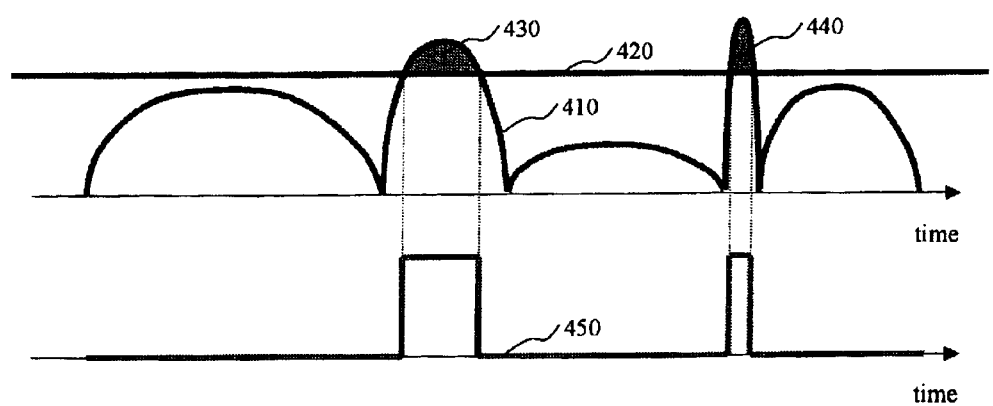
FIG. 4 is a drawing of example waveforms in an alternative preferred embodiment of the invention.

The manner in which this reformulation works is illustrated in FIG. 4. The waveform $|v(t)-\bar{v}(t)|$ is shown in FIG. 4 (waveform 410) and is always positive. The value z is independent of the component values and/or sizes p and independent of time and is therefore shown as a straight line (420). The quantity $\{z-|v(t)-\bar{v}(t)|\}$ is negative only in two subintervals of time (430 and 440), hence the integral in the formulation is the sum of the two shaded areas (430 and 440). When the above optimization problem is solved, z is at its lowest possible value, but the shaded area is zero, hence the highest point of $|v(t)-\bar{v}(t)|$ has been minimized, which corresponds to our metric. Again, the time boundaries of the shaded areas are functions of p but since the integrand is zero at such boundaries, this sensitivity can be ignored as a consequence of Leibniz's theorem.

To constrain the metric in the alternative preferred embodiment, the following optimization formulation is employed:

$$\min_{p} \text{ other objective function(s)}$$

$$\int_{t_0}^{t_f} \min[0, \{k - |v(t) - \bar{v}(t)|\}] dt = 0$$

s.t. other constraints, where k is the maximum tolerable absolute deviation between the desired waveform and the actual waveform during the time interval of interest.

Now that the alternative metric has been defined and the optimization problem suitably reformulated, all that is required is to compute the gradients of the integral equality constraints in the above reformulations with respect to all the component values and/or sizes. Again, this is described using the direct method, the adjoint method and the all-at-once adjoint method. Depending on the situation at hand, the actual method to be applied can be chosen.

In the direct method, the subintervals of time in which z or k is smaller than $|v(t)-\bar{v}(t)|$ are noted, and the value of the integral constraints in the re-formulations above are obtained during the nominal simulation. The waveform required as excitation to the sensitivity circuit is also stored during the nominal simulation. Then the sensitivity circuit is suitably configured and analyzed. The integral of s(t)-$\hat{v}(t)$ in all such subintervals of time is computed, where $\hat{v}(t)$ is the transient sensitivity waveform of the signal whose waveform is being matched. This procedure yields the gradient of the reformulated constraint with respect to one component value and/or size. Simultaneously, the gradients for all the waveform shaping considerations as well as gradients of all other measurements corresponding to other optimization considerations can be computed by a single sensitivity analysis. This procedure is repeated for each tunable component value and/or size to obtain all the gradients of boxes 140 and 220 of FIG. 2. As is well known in regard to the direct method, all nominal and sensitivity analyses of the circuit can be performed simultaneously, with the time-steps of all the circuits moving in lock step.

In the adjoint method, a zero-valued current source is added at each node whose voltage is required to have a desired waveform shape. These current sources do not change the nominal simulation results. During nominal simulation, the subintervals of time in which or is smaller than $|v(t)-\bar{v}(t)|$ are noted, and the value of the integral equality constraints in the re-formulation are computed, as in the direct method. All the required waveforms for convolution purposes are stored. Then the adjoint circuit is suitably configured by replacing each component with its adjoint equivalent. A signed unit square wave (450 in FIG. 4) during the noted subintervals of time is employed as the excitation for the adjoint circuit. With this choice of excitation, the adjoint circuit is analyzed backwards in time. The waveforms of the nominal and adjoint circuits are convolved to obtain the gradients of one function (metric or measurement) with respect to all component values and/or sizes in a single analysis. The procedure is repeated for each metric or measurement of interest until all the gradients of boxes 140 and 220 of FIG. 2 are obtained.

In the all-at-once adjoint method, the individual excitations for each metric or measurement are determined just as in the adjoint method, and an adjoint circuit created. The difference is that scaled versions of these excitations are all applied simultaneously to the adjoint circuit. The scale factors are functions of how the metrics and measurements appear in the scalar merit function of the optimizer, and may be functions of the nominal simulation results. With this choice of excitation, the nominal and adjoint waveforms are convolved to obtain the gradients of the merit function of the optimizer with respect to all the tunable component values and/or sizes, no matter how many metrics are involved, no matter how many measurements are involved and no matter how many tunable components and/or sizes are being tuned in the optimization.

In all three methods (direct, adjoint and adjoint-at-a-time) the LU factors of the converged solution of the nominal circuit at each time point can be reused for efficient solution of the sensitivity or adjoint circuit, as the case may be.

It is to be understood that, given this disclosure, various other metrics can be defined for the purposes of this invention. Their gradients can be computed by similar efficient methods as in this invention by one of ordinary skill in the art.

It is to be understood that, given this disclosure, while the preferred embodiments were explained in terms of voltage waveforms, similar methods can be used to optimize circuits with current waveform shaping considerations by one of ordinary skill in the art.

It is to be understood that, given this disclosure, while the preferred embodiments were explained in the time domain, they can be extended to the frequency domain by one of ordinary skill in the art.

It is to be understood that, given this disclosure, waveform shaping can thus be included by one of ordinary skill in the art as part of any circuit optimization procedure in which it is desired to match one or more waveform shapes.

I claim:

1. A method for optimizing an electrical circuit by tuning one or more component sizes and values, the method comprising:

formulating an optimization problem involving one or more waveform shaping requirements;

determining one or more behaviors of the electrical circuit including one or more actual waveforms of the electrical circuit;

generating one or more error signals, wherein each of said one or more error signals is a difference between one actual waveform and one corresponding desired waveform of the electrical circuit;

determining one or more quality metrics from each of said one or more error signals, wherein each of said one or more quality metrics is a single valued measure of a match between said one actual waveform and said one corresponding desired waveform;

determining the values of the one or more of the quality metrics and gradients of the one or more of the quality metrics with respect to the one or more of the component sizes and values; and using the values and gradients of the one or more of the quality metrics to iteratively change the component sizes and values so that each said one actual waveform more closely matches said one corresponding desired waveform.

2. A method, as in claim 1, where the formulated optimization problem is solved optimally.

3. A method, as in claim 1, where the quality metric is an integral of the absolute deviation between said one actual waveform and said one corresponding desired waveform.

4. A method, as in claim 3, where a weighting waveform is applied to the quality metric to indicate a relative importance of waveform matching in different subintervals of time.

5. A method, as in claim 1, where the single valued measure is a maximum absolute deviation between said one actual waveform and said one corresponding desired waveform.

6. A method, as in claim 1, where the optimization is carried out with one or more other optimization considerations including one or more of the following: delay, rise/fall time, power, area, noise considerations, signal-to-noise ratio, and gain.

7. A method, as in claim 6, where the optimization is carried out with one or more other optimization considerations expressed as objective functions.

8. A method, as in claim 6, where the optimization is carried out with one or more other optimization considerations expressed as constraints.

9. A method, as in claim 6, where the optimization is carried out with one or more other optimization considerations expressed as simple bounds.

10. A method, as in claim 1, where the optimization is a multi-objective optimization.

11. A method, as in claim 1, where one or more waveforms matching requirements are expressed as objective functions.

12. A method, as in claim 1, where one or more waveforms matching requirements are expressed as constraints.

13. A method, as in claim 1, where the waveform matching requirements on one or more signals are in one or more subintervals of time.

14. A method, as in claim 13, in which the subintervals of time are overlapping.

15. A method, as in claim 13, in which the subintervals of time are not overlapping.

16. A method, as in claim 1, in which the waveform matching is desired in one of the time domain and the frequency domain.

17. A method, as in claim 1, where the electrical circuit is one of: a clock distribution and power distribution circuit.

18. A method, as in claim 1, where the electrical circuit is a communication circuit.

19. A method, as in claim 1, where the electrical circuit is a logic circuit.

20. A method, as in claim 1, where the electrical circuit is an analog circuit.

21. A method, as in claim 1, where the electrical circuit is a digital circuit.

22. A method, as in claim 1, in which the gradients are computed by a direct method.

23. A method, as in claim 1, in which the gradients are computed by an adjoint method.

24. A method, as in claim 1, in which the gradients are computed by an all-at-once adjoint method.

25. A method, as in claim 24, in which a merit function of an optimizer is one of:
- a Lagrangian merit function,
- an adjoint Lagrangian merit function,
- an exact penalty function,
- an inexact penalty function and
- a barrier function.

26. A method, as in claim 1, in which the gradients of the quality metric of a single waveform shape are determined with respect to a plurality of the components by a single adjoint analysis.

27. A method, as in claim 1, in which the gradients of a plurality of quality metrics are determined with respect to a single component by a single direct method analysis.

28. A method, as in claim 1, in which the gradients of a merit function of an optimizer are determined with respect to a plurality of components by a single adjoint analysis.

29. A method, as in claim 1, in which the actual waveform is one of a node voltage waveform, a branch current waveform and a branch voltage waveform.

30. A method, as in claim 1, in which the single valued measure of each error signal is one of the following:
- a root-mean-square measure of the error signal,
- the largest positive value of the error signal,
- the largest negative value of the error signal and
- the largest absolute value of the error signal.

31. A method, as in claim 1, in which the single valued measure of each error signal is any scalar norm of the error signal.

32. A storage device, storing a method for optimizing an electrical circuit by tuning one or more component sizes and values, the method comprising:
- formulating an optimization problem involving one or more waveform shaping requirements;
- determining one or more behaviors of the electrical circuit including one or more actual waveforms of the electrical circuit;
- generating one or more error signals, wherein each of said one or more error signals is a difference between one actual waveform and one corresponding desired waveform of the electrical circuit;
- determining one or more quality metrics from each of said one or more error signals, wherein each of said one or more quality metrics is an integral of an absolute deviation between said one actual and said one corresponding desired waveform;
- determining the values of the one or more of the quality metrics and gradients of the one or more of the quality metrics with respect to the one or more of the component sizes and values; and
- using the values and gradients of the one or more of the quality metrics to iteratively change the component sizes and values so that said one or more error signals are reduced.

33. A computer system for optimizing an electrical circuit by tuning one or more component sizes and values, the method comprising:
- a module to formulate an optimization problem having one or more waveform shaping requirements;
- a module to determine one or more behaviors of the electrical circuit including one or more actual waveforms of the electrical circuit;
- one or more error signals, wherein each of said one or more error signals is a difference between one actual waveform and one corresponding desired waveform of the electrical circuit;
- one or more quality metrics from each of said one or more error signals, wherein each of said one or more quality metrics is a single valued measure of a match between said one actual waveform and said one corresponding desired waveform;
- one or more values of the one or more of the quality metrics; and
- one or more gradients of the one or more of the quality metrics with respect to the one or more of the component sizes and values, wherein the values and gradients of the one or more of the quality metrics are used to iteratively change the component sizes and values so that said one or more error signals are reduced.

34. A system for optimizing an electrical circuit by tuning one or more component sizes and values, the method comprising:
- means for formulating an optimization problem involving one or more waveform shaping requirements;
- means for determining one or more behaviors of the electrical circuit including one or more actual waveforms of the electrical circuit;
- means for generating one or more error signals, wherein each of said one or more signals is a difference between one actual waveform and one corresponding desired waveform of the electrical circuit;
- means for determining one or more quality metrics fro each of said one or more error signals, wherein each of said one or more quality metrics is a single valued measure of a match between said one actual waveform and said one corresponding desired waveform;
- means for determining the values of the one or more of the quality metrics and gradients of the one or more of the quality metrics with respect to the one or more of the component sizes and values; and
- means for using the values and gradients of the one or more of the quality metrics to iteratively change the component sizes and values so that said one or more error signals are reduced.

* * * * *